US012598932B2

(12) United States Patent
Chang et al.

(10) Patent No.: US 12,598,932 B2
(45) Date of Patent: Apr. 7, 2026

(54) METHODS AND STRUCTURES FOR IMPROVING ETCH PROFILE OF UNDERLYING LAYERS

(71) Applicant: Tokyo Electron Limited, Tokyo (JP)

(72) Inventors: Shihsheng Chang, Albany, NY (US); Yen-Tien Lu, Albany, NY (US); Du Zhang, Albany, NY (US); Kai-Hung Yu, Albany, NY (US); David L O'Meara, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 253 days.

(21) Appl. No.: 18/373,080

(22) Filed: Sep. 26, 2023

(65) Prior Publication Data

US 2025/0105015 A1 Mar. 27, 2025

(51) Int. Cl.
H01L 21/308 (2006.01)
H01L 21/027 (2006.01)
H01L 21/033 (2006.01)

(52) U.S. Cl.
CPC ...... H01L 21/3086 (2013.01); H01L 21/0273 (2013.01); H01L 21/0332 (2013.01); H01L 21/0337 (2013.01); H01L 21/3081 (2013.01)

(58) Field of Classification Search
CPC ............. H01L 21/3086; H01L 21/0273; H01L 21/0332; H01L 21/0337; H01L 21/3081; H01L 21/0212; H01L 21/02271; H01L 21/02697; H01L 21/31144
USPC .................................................. 438/694–714
See application file for complete search history.

(56) References Cited

U.S. PATENT DOCUMENTS

| | | | | |
|---|---|---|---|---|
| 9,905,754 | B1* | 2/2018 | Yoon | H10N 50/01 |
| 11,195,723 | B1* | 12/2021 | Chang | H01L 21/3065 |
| 11,594,420 | B1* | 2/2023 | Chang | H01L 21/76898 |
| 2020/0243326 | A1* | 7/2020 | Zhou | H10D 84/038 |
| 2022/0351982 | A1 | 11/2022 | Shen et al. | |

(Continued)

FOREIGN PATENT DOCUMENTS

| | | |
|---|---|---|
| KR | 10-2008-0081634 A | 9/2008 |
| KR | 10-2010-0003076 A | 1/2010 |

(Continued)

OTHER PUBLICATIONS

International Search Report and Written Opinion on International Application No. PCT/US2024/037514 dated Oct. 25, 2024 (9 pages).

*Primary Examiner* — Duy Vu N Deo
(74) *Attorney, Agent, or Firm* — Foley & Lardner LLP

(57) ABSTRACT

Semiconductor devices and corresponding methods of manufacture are disclosed. The method may include forming a first hardmask layer over a substrate. The method may include forming a second hardmask layer over the first hardmask layer. The method may include transferring a pattern from the second hardmask layer to the first hardmask layer, wherein the pattern in the first hardmask layer comprises a plurality of protruding structures, and each of the plurality of protruding structures has respective portions of its two sidewalls extending toward each other. The method may include depositing a modification layer extending along at least the respective portions of the sidewalls of each of the protruding structures. The method may include etching the substrate with the protruding structures and the modification layer both serving as a mask.

18 Claims, 9 Drawing Sheets

200

610

210

205

(56)　　　　　　References Cited

U.S. PATENT DOCUMENTS

2023/0197465 A1 *　6/2023　Marchegiani ........... H01L 21/32
438/714

FOREIGN PATENT DOCUMENTS

KR　　10-2010-0076308　A　　7/2010
KR　　10-2021-0050953　　　　5/2021

* cited by examiner

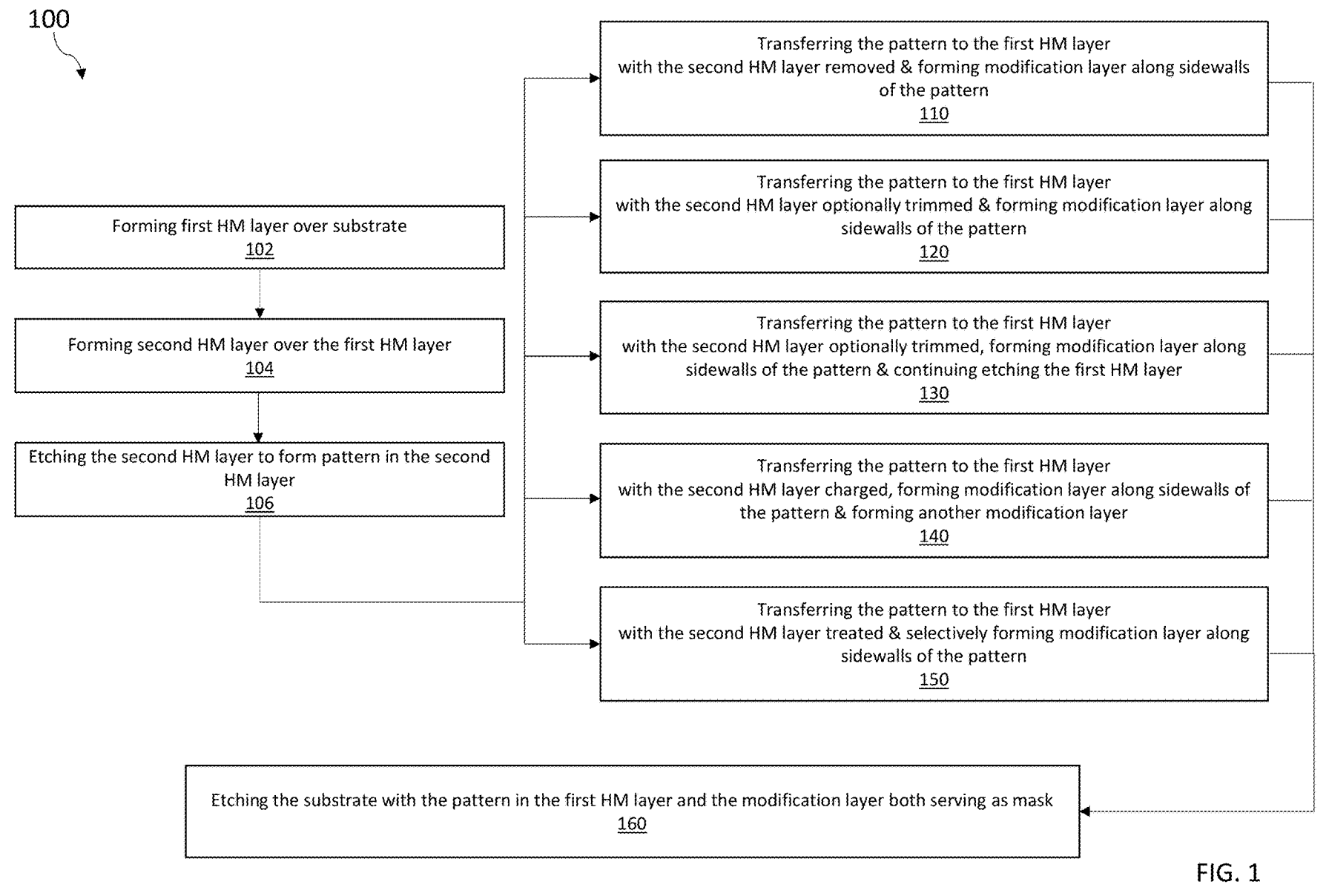

100

Forming first HM layer over substrate
102

Forming second HM layer over the first HM layer
104

Etching the second HM layer to form pattern in the second HM layer
106

Transferring the pattern to the first HM layer with the second HM layer removed & forming modification layer along sidewalls of the pattern
110

Transferring the pattern to the first HM layer with the second HM layer optionally trimmed & forming modification layer along sidewalls of the pattern
120

Transferring the pattern to the first HM layer with the second HM layer optionally trimmed, forming modification layer along sidewalls of the pattern & continuing etching the first HM layer
130

Transferring the pattern to the first HM layer with the second HM layer charged, forming modification layer along sidewalls of the pattern & forming another modification layer
140

Transferring the pattern to the first HM layer with the second HM layer treated & selectively forming modification layer along sidewalls of the pattern
150

Etching the substrate with the pattern in the first HM layer and the modification layer both serving as mask
160

FIG. 1

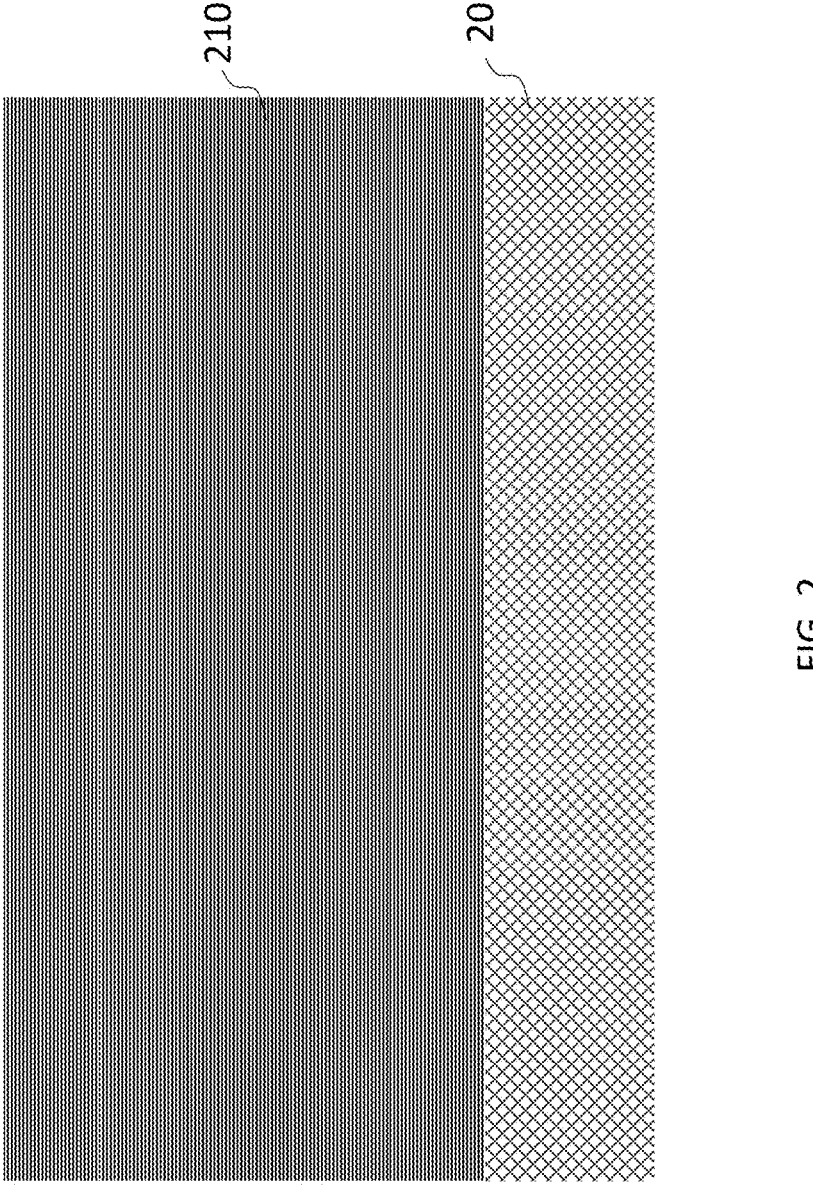
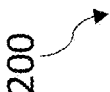
FIG. 2

310

210

205

200

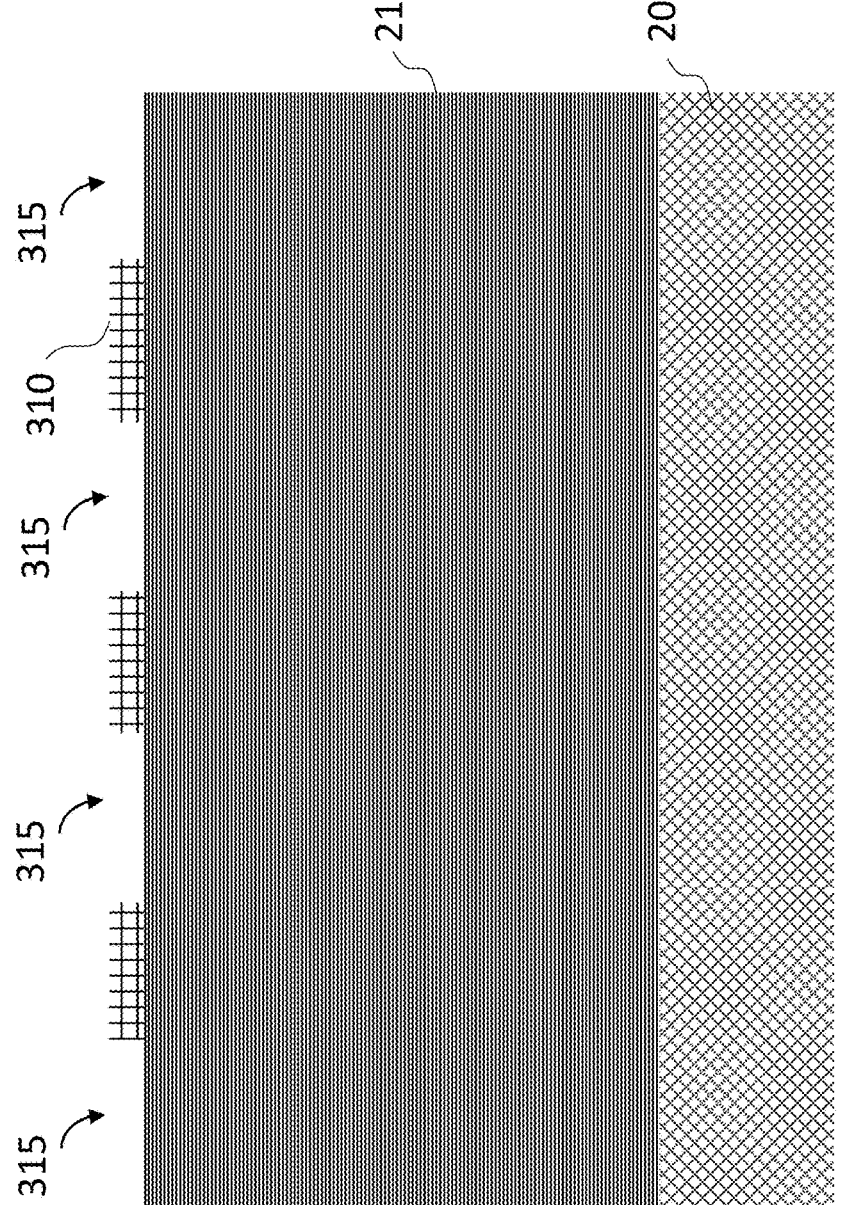
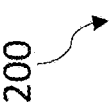
FIG. 4

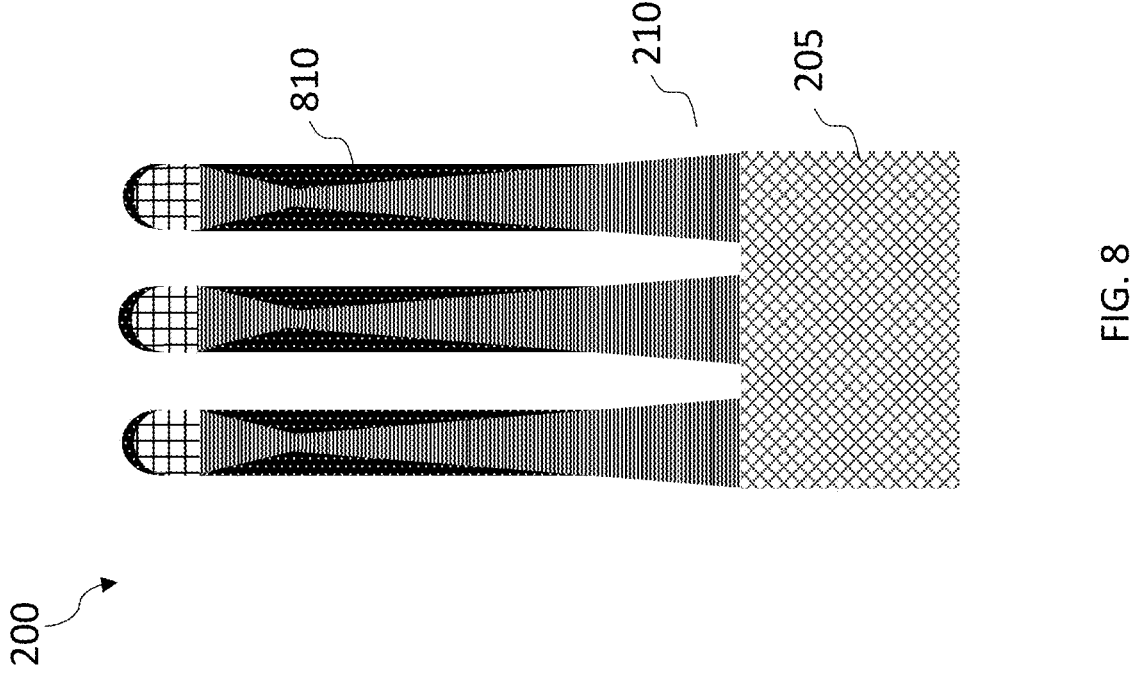
FIG. 8
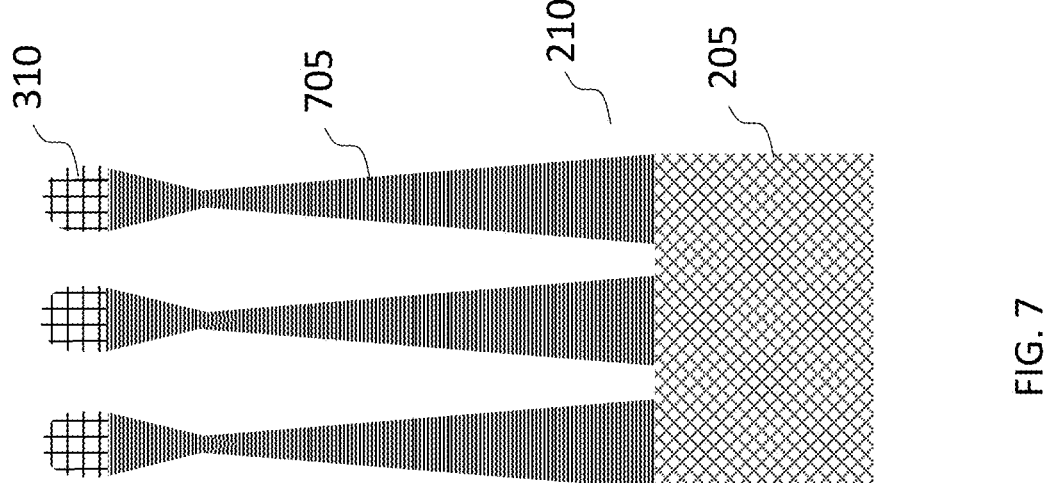
FIG. 7
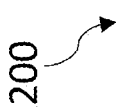

METHODS AND STRUCTURES FOR IMPROVING ETCH PROFILE OF UNDERLYING LAYERS

FIELD OF THE DISCLOSURE

This disclosure generally relates to methods for fabricating semiconductor devices, and more particularly to forming a modification layer along sidewalls of a pattern for improving etched profile.

BACKGROUND

In the manufacture of a semiconductor device, various fabrication processes are executed such as film-forming depositions, etch mask creation, patterning, material etching and removal, and doping treatments. These processes are performed repeatedly to form desired semiconductor device elements on a substrate. While semiconductor devices have scaled down with their feature sizes decreased and aspect ratios increased, such scaling efforts are running into greater challenges as scaling enters single digit nanometer semiconductor device fabrication processes. Although nanoscale semiconductor fabrication processes have been successfully demonstrated and implemented, various embodiments can include numerous operations, and may include increasing stability of semiconductor device element or features.

SUMMARY

The present disclosure relates to methods and structures of improving etch profile of underlying layers. The methods disclosed herein may include trimming a hard mask layer, forming a silicon-containing layer, and/or forming a lining layer. The methods, structures, and techniques described herein provide improved etch profile in underlying layers, thereby enhancing the performance reliability of devices.

One aspect of the present disclosure can be directed to a method for fabricating semiconductor devices. The method may include forming a first hardmask layer over a substrate. The method may include forming a second hardmask layer over the first hardmask layer. The method may include transferring a pattern from the second hardmask layer to the first hardmask layer, wherein the pattern in the first hardmask layer comprises a plurality of protruding structures, and each of the plurality of protruding structures has respective portions of its two sidewalls extending toward each other. The method may include depositing a modification layer extending along at least the respective portions of the sidewalls of each of the protruding structures. The method may include etching the substrate with the protruding structures and the modification layer both serving as a mask.

In some embodiments, the substrate includes one or more dielectric layers, the first hardmask layer includes an amorphous carbon layer or an organic under layer, and the second hardmask layer includes silicon oxynitride.

In some embodiments, the portions of the sidewalls of each of the protruding structures are spaced from each other with a first distance that is shorter than a second distance of any other portions of the sidewalls. The first distance combined with two times a thickness of the modification layer is about equal to the second distance.

In some embodiments, the modification layer includes metal atoms.

In some embodiments, the modification layer includes a polymer consisting of carbon atoms and fluorine atoms.

In some embodiments, the step of depositing a modification layer further comprises depositing the modification layer using a non-cyclic deposition process, and wherein the non-cyclic deposition process comprises: a Chemical Vapor Deposition (CVD) process and a Physical Vapor Deposition (PVD) process.

In some embodiments, prior to depositing the modification layer, the method may further include completely removing the second hardmask layer.

In some embodiments, while depositing the modification layer, the method may further include retaining at least a portion of the second hardmask layer.

In some embodiments, the method may further include, prior to depositing the modification layer, transferring the pattern from the second hardmask layer to the first hardmask layer by partially etching the first hardmask layer. the method may further include, subsequently to depositing the modification layer, continuing transferring the pattern by etching through a remaining portion of the first hardmask layer.

In some embodiments, the method may further include depositing another modification layer over the modification layer using an Atomic Layer Deposition (ALD) process.

In some embodiments, the method may further include modifying an exposed surface of the second hardmask layer; and depositing the modification layer only on the first hardmask layer.

Another aspect of the present disclosure can be directed to a method for fabricating semiconductor devices. The method may include forming a first hardmask layer over a substrate. The method may include forming a second hardmask layer over the first hardmask layer. The method may include transferring a pattern of the second hardmask layer to the first hardmask layer. The method may include depositing a modification layer extending along a recessed portion of the pattern in the first hardmask layer. The method may include etching the substrate with the pattern in the first hardmask layer and the modification layer both serving as a mask.

In some embodiments, the modification layer includes metal atoms.

In some embodiments, the modification layer includes a polymer consisting of carbon atoms and fluorine atoms.

In some embodiments, the step of depositing a modification layer further comprises depositing the modification layer using a non-cyclic deposition process.

In some embodiments, the non-cyclic deposition process comprises: a Chemical Vapor Deposition (CVD) process and a Physical Vapor Deposition (PVD) process.

Yet another aspect of the present disclosure can be directed to a method for fabricating semiconductor devices. The method may include forming a first hardmask layer over a substrate. The method may include forming a second hardmask layer over the first hardmask layer. The method may include transferring a pattern of the second hardmask layer to the first hardmask layer. The method may include forming a modification layer extending along a recessed portion of the pattern in the first hardmask layer using a non-cyclic deposition process. The method may include etching the substrate with the pattern in the first hardmask layer and the modification layer both serving as a mask.

In some embodiments, the modification layer includes metal atoms.

In some embodiments, the modification layer includes a polymer consisting of carbon atoms and fluorine atoms.

The order of discussion of the different steps as described herein has been presented for clarity's sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

These and other aspects and implementations are discussed in detail below. The foregoing information and the following detailed description include illustrative examples of various aspects and implementations and provide an overview or framework for understanding the nature and character of the claimed aspects and implementations. The drawings provide illustrations and a further understanding of the various aspects and implementations and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings:

FIG. 1 shows a flow chart of a method for fabricating a semiconductor device, according to some embodiments.

FIGS. 2-17 show cross-sectional views of a semiconductor device during various fabrication stages, according to some embodiments.

DETAILED DESCRIPTION

Figure 3:
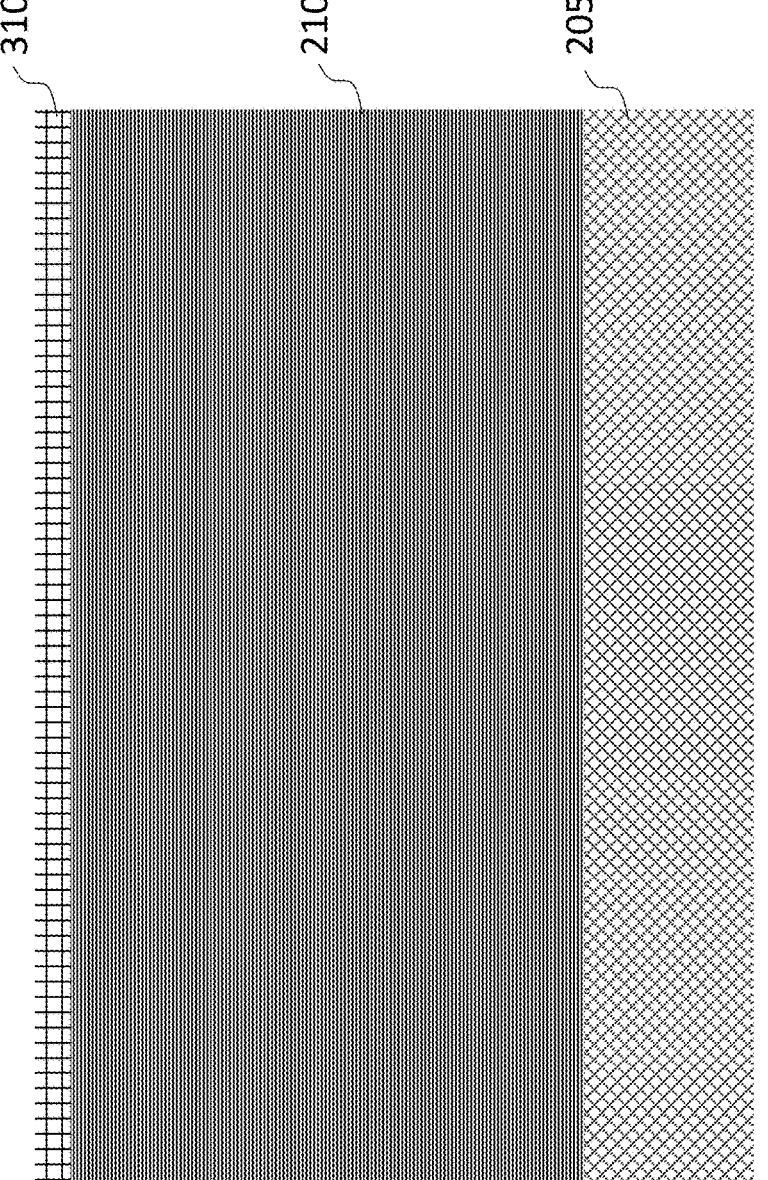

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Techniques herein include methods and devices for improving etch profile of underlying layers in a semiconductor device. Specifically, techniques include trimming a hard mask layer, forming a silicon-containing layer, and/or forming a lining layer. This allows for additional hardmask margin for etching an underlying layer (e.g., a substrate, a dielectric, etc.) while reducing a bowing profile associated with the hard mask. Accordingly, etch profile with high aspect ratio and enhanced performance reliability can be achieved with such techniques. Techniques herein can be used during in-situ and ex-situ processes, which allows for flexible application of such techniques. For example, techniques described herein can be applied to various dielectric etch processes and applications, for example in fabrication processes of memory and logic devices.

Reference will now be made to the figures, which for the convenience of visualizing the fabrication techniques described herein, illustrate a variety of materials undergoing a process flow in various views. Unless expressly indicated otherwise, each Figure represents one (or a set) of fabrication steps in a process flow for manufacturing the devices described herein. In the various views of the Figures, connections between conductive layers or materials may or may not be shown. However, it should be understood that connections between various layers, masks, or materials may be implemented in any configuration to create electric or electronic circuits. When such connections are shown, it should be understood that such connections are merely illustrative and are intended to show a capability for providing such connections and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, the techniques described herein may be implemented in any shape or geometry for any material or layer to achieve desired results. In addition, examples in which two transistors or devices are shown stacked on top of one another are shown for illustrative purposes only, and for the purposes of simplicity. Indeed, the techniques described herein may provide for one to any number of stacked devices. Further, although the devices fabricated using these techniques are shown as transistors, it should be understood that any type of electric electronic device may be manufactured using such techniques, including but not limited to transistors, variable resistors, resistors, and capacitors.

FIG. 1 illustrates a flow chart of a method 100 for fabricating a semiconductor device, in accordance with some embodiments. It is noted that the method 100 is merely an example and is not intended to limit the present disclosure. Accordingly, it is understood that additional operations may be provided before, during, and after the method 100 of FIG. 1, that any operation may be omitted, and that some other operations may only be briefly described herein.

In various embodiments, operations of the method 100 may be associated with cross-sectional views of an example structure at various fabrication stages as shown in FIGS. 2 to 17, which will be discussed in further detail below. It should be understood that the structure, shown in FIGS. 2 to 17, may include a number of other structures, while remaining within the scope of the present disclosure.

In brief overview, the method 100 starts with operation 102 of forming a first hardmask layer over a substrate. The method 100 continues to operation 104 of forming a second hardmask layer over the first hardmask layer. The method 100 can proceed to operation 106 of etching the second hardmask layer to form a pattern in the second hardmask layer. In various embodiments, the method 100 can proceed to any of operation 110, 120, 130, 140, or 150. In operation 110, the pattern is transferred to the first hardmask layer with the second hardmask layer removed, followed by forming a modification layer along sidewalls of the pattern. In operation 120, the pattern is transferred to the first hardmask layer with the second hardmask layer optionally trimmed, followed by forming a modification layer along sidewalls of the pattern. In operation 130, the pattern is transferred to the first hardmask layer with the second hardmask layer optionally trimmed, followed by forming a modification layer along sidewalls of the pattern and then continuing etching the first hardmask layer. In operation 140, the pattern is transferred to the first hardmask layer with the second hardmask layer optionally trimmed, followed by forming a modification layer along sidewalls of the pattern and then forming another modification layer. In operation 150, the pattern is transferred to the first hardmask layer with the second hardmask layer treated, followed by selectively forming a modification layer along sidewalls of the pattern. Following any of operation 110, 120, 130, 140, or 150, the method 100 can next proceed to operation 160 of etching the substrate with the pattern in the first hardmask layer and the modification layer both serving as a mask.

Corresponding to operation 102 of FIG. 1, FIG. 2 is a cross-sectional view of a structure 200 in which a first hardmask layer 210 of a first material is formed over a substrate 205. In some embodiments, the substrate 205 may serve as a target to be patterned, with at least the first hardmask layer 210 serving as a patterned mask to transfer a pattern to the underlying substrate 205. For example, the substrate 205 may be a semiconductor substrate, such as a bulk semiconductor, a semiconductor-on-insulator (SOI) substrate, or the like, which may be doped (e.g., with a p-type or an n-type dopant) or undoped. The substrate 205 may be a wafer, such as a silicon wafer. Other substrates, such as a multi-layered or gradient substrate may also be used. In another example, the substrate 205 may be an intermetal dielectric (e.g., silicon oxide or otherwise low-k dielectric material). In yet another example, the structure 200 may be a portion of a 3D NAND memory device, and the substrate 205 may include a stack of different dielectric materials (e.g., oxide-nitride-oxide-nitride (ONON)) alternately arranged on top of one another. The thickness of such a stack layer may vary. For example, the thickness of the ONON layer may be around 8 μm.

The first hardmask layer 210 of the first material can be formed over the substrate 205. In some examples, the first hardmask layer 210 can be spin-coated, placed, grown (e.g., epitaxially with or without a seed layer), or otherwise formed over the substrate 205. The first hardmask layer 210 may be or include a light-sensitive material (e.g., photoresist) configured to pattern the substrate 205. In some examples, the first hardmask layer 210 may be or include an amorphous carbon layer (ACL) or an organic under layer (ODL) such as, for example, $CH_4$ and/or $C_2H_2$. In some examples, the first hardmask layer 210 may be or include an amorphous silicon layer or a metal containing layer such as metal oxide. In some examples, the first hardmask layer 210 may be or include an organic dielectric layer or organic dielectric. A thickness of the first hardmask layer 210 may vary. As a non-limiting example, the thickness of the first hardmask layer 210 may be around 3 μm.

According to various examples, the formation of the one or more layers of the structure 200 can include planarization of the layers, such as by cutting, ablation, chemical mechanical grinding or polishing (CMG/P), or other planarization techniques.

Corresponding to operation 104 of FIG. 1, FIG. 3 is a cross-sectional view of the structure 200 in which a second hardmask layer 310 of a second material is formed over the first hardmask layer 210, in accordance with various embodiments. The second hardmask layer 310 of the second material can be formed over the first hardmask layer 210. In some examples, the second hardmask layer 310 can be spin-coated, placed, grown (e.g., epitaxially with or without a seed layer), or otherwise formed over the first hardmask layer 210. The second hardmask layer 310 may be or include a light-sensitive material (e.g., photoresist) configured to pattern the first hardmask layer 310. In some examples, the second hardmask layer 310 may be or include silicon oxynitride or such a layer. A thickness of the second hardmask layer 310 may vary. In some examples, the second hardmask layer 310 may be thinner than the first hardmask layer 210. As a non-limiting example, the thickness of the second hardmask layer 310 may be around 0.3 μm.

Corresponding to operation 106 of FIG. 1, FIG. 4 is a cross-sectional view of the structure 200 in which the second hardmask layer 310 is etched to form a pattern 315 in the second hardmask layer 310, in accordance with various embodiments. For example, the pattern 315 may be formed by directionally etching one or more portions of the second hardmask layer 310 using a patternable layer (e.g., a photoresist) toward the top of the first hardmask layer 210. In some examples, the operation 106 may be omitted, when for example, the second hardmask layer 310 is a pre-patterned or a patterned layer.

Figure 6:
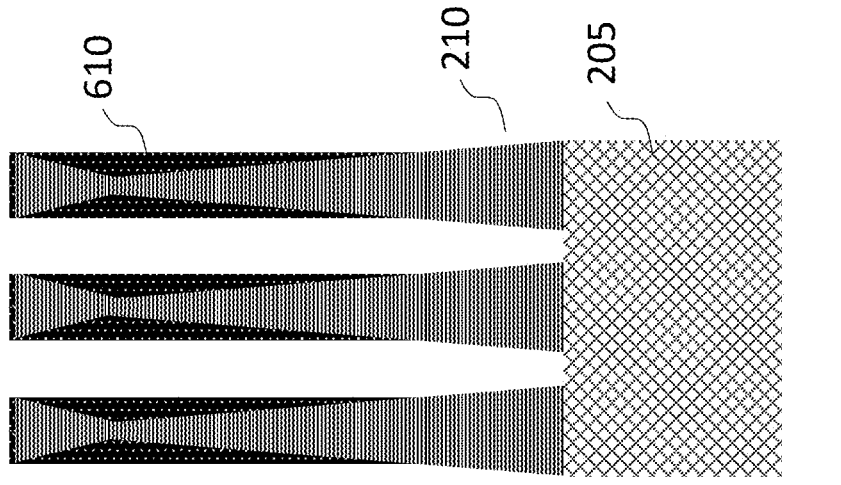
Figure 5:
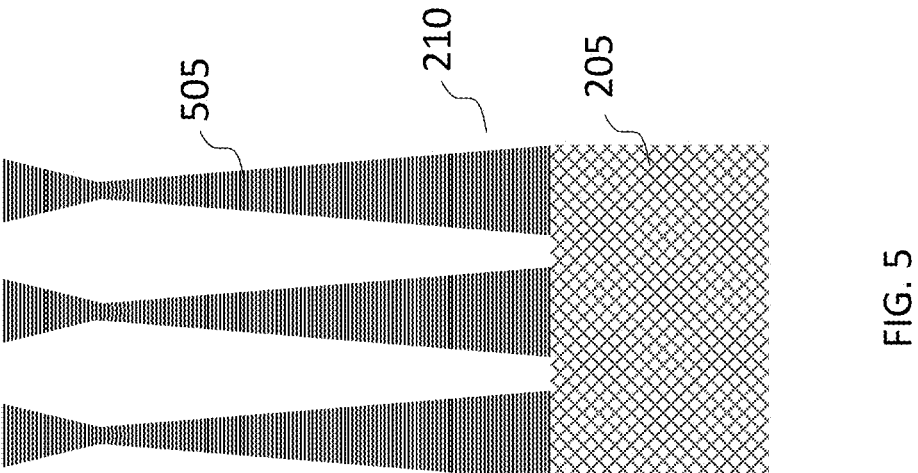

Corresponding to operation 110 of FIG. 1, FIG. 5 is a cross-sectional view of the structure 200 in which the pattern 315 (FIG. 4) is transferred to the first hardmask layer 210 and the second hardmask layer 310 is removed, in accordance with various embodiments. Still corresponding to operation 110 of FIG. 1, FIG. 6 is a cross-sectional view of the structure 200 in which a modification layer 610 is formed along sidewalls of the pattern transferred into the first hardmask layer 210, in accordance with various embodiments.

In some embodiments, the pattern 315 in the second hardmask layer 310 may be transferred to the first hardmask layer 210 by selectively etch the first hardmask layer 210, forming one or more protruding structures 505, as shown in FIG. 5. For example, the protruding structures 505 can be formed by directionally etching the first hardmask layer 210 through a number of reactive ions. In some embodiments, an upper portion of the protruding structures 505 may include a bowing portion. Such a bowing portion may result from deflection of the ions. Stated another way, the upper portions of sidewalls of each of the protruding structures 505 are spaced from each other with a first distance that is shorter than a second distance of any other portions of the sidewalls. The bowing portion may sometimes be referred to as a (e.g., laterally) recessed portion.

After forming the protruding structures 505 (or transferring the pattern 315 from the second hardmask layer 310 to the first hardmask layer 210), the second hardmask layer 310 may be completely or almost completely removed. Next, the modification layer 610 is formed to extend along at least the upper portions of the sidewalls of the protruding structures 505, as shown in FIG. 6. In various embodiments of the present disclosure, the modification layer 610 can be formed by a non-cyclic deposition process (e.g., a Chemical Vapor Deposition (CVD) process and a Physical Vapor Deposition (PVD) process), thereby allowing the modification layer 610 to be formed with a greater thickness around the recessed portions of the protruding structures 505. As such, the modification layer 610 can compensate the distance difference between the recessed portion and the other portions. Stated another way, the protruding structures 505 can each be modified to have its sidewalls spaced from each other with a uniform distance. In some embodiments, the distance of the recessed portion combined with two times a (e.g., maximum) thickness of the modification layer 610 is about equal to the distance of other non-recessed portions.

In one aspect of the present disclosure, the modification layer 610 may include metal atoms. For example, the modification layer 610 may consist of tantalum nitride (TaN). As a non-limiting example, the modification layer 610 can be formed by a PVD process with the following recipe: Ta(N) composition: 0%-30% (Ar/N flow rate friction: 0-0.3), Temperature: −30 C to room temperature, Pressure: 0.1 mT to 90 mT, DC: 1000 to 12000 W, ICP: 1000 to 6000 W, Stage bias: 200-700 W. In one aspect of the present disclosure, the modification layer 610 may include a polymer consisting of carbon atoms and fluorine atoms. For example, the modification layer 610 may consist of a fluoropolymer or fluoroplastic. As a non-limiting example, the modification layer 610 can be formed by a CVD process with the following recipe: pressure of 30 millitorr (mT), high-frequency power of about 1700 watts (W), low-frequency power of about 4500 watts (W), flow of tetrafluoromethane ($CF_4$) at about 30 sccm, and flow of argon (Ar) at about 600 sccm.

Corresponding to operation 120 of FIG. 1, FIG. 7 is a cross-sectional view of the structure 200 in which the pattern 315 (FIG. 4) is transferred to the first hardmask layer 210 and the second hardmask layer 310 remains and may be optionally trimmed, in accordance with various embodiments. Still corresponding to operation 120 of FIG. 1, FIG. 8 is a cross-sectional view of the structure 200 in which a modification layer 810 is formed along sidewalls of the pattern transferred into the first hardmask layer 210 and further over a top surface of the (e.g., trimmed) second hardmask layer 310, in accordance with various embodiments.

In some embodiments, the pattern 315 in the second hardmask layer 310 may be transferred to the first hardmask layer 210 by selectively etch the first hardmask layer 210, forming one or more protruding structures 705, as shown in FIG. 7. For example, the protruding structures 705 can be formed by directionally etching the first hardmask layer 210 through a number of reactive ions. In some embodiments, an upper portion of the protruding structures 705 may include a bowing portion. Such a bowing portion may result from deflection of the ions. Stated another way, the upper portions of sidewalls of each of the protruding structures 705 are spaced from each other with a first distance that is shorter than a second distance of any other portions of the sidewalls. The bowing portion may sometimes be referred to as a (e.g., laterally) recessed portion.

During or after forming the protruding structures 705 (or transferring the pattern 315 from the second hardmask layer 310 to the first hardmask layer 210), the second hardmask layer 310 may be trimmed. Next, the modification layer 810 is formed to extend along at least the upper portions of the sidewalls of the protruding structures 705 and overlay the top surface of the second hardmask layer 310, as shown in FIG. 8. In various embodiments of the present disclosure, the modification layer 810 can be formed by a non-cyclic deposition process (e.g., a Chemical Vapor Deposition (CVD) process and a Physical Vapor Deposition (PVD) process), thereby allowing the modification layer 810 to be formed with a greater thickness around the recessed portions of the protruding structures 705. As such, the modification layer 810 can compensate the distance difference between the recessed portion and the other portions. Stated another way, the protruding structures 705 can each be modified to have its sidewalls spaced from each other with a uniform distance. In some embodiments, the distance of the recessed portion combined with two times a (e.g., maximum) thickness of the modification layer 810 is about equal to the distance of other non-recessed portions.

In one aspect of the present disclosure, the modification layer 810 may include metal atoms. For example, the modification layer 810 may consist of tantalum nitride (TaN). As a non-limiting example, the modification layer 810 can be formed by a PVD process with the following recipe: Ta(N) composition: 0%-30% (Ar/N flow rate friction: 0-0.3), Temperature: −30 C to room temperature, Pressure: 0.1 mT to 90 mT, DC: 1000 to 12000 W, ICP: 1000 to 6000 W, Stage bias: 200-700 W. In one aspect of the present disclosure, the modification layer 810 may include a polymer consisting of carbon atoms and fluorine atoms. For example, the modification layer 810 may consist of a fluoropolymer or fluoroplastic. As a non-limiting example, the modification layer 810 can be formed by a CVD process with the following recipe: pressure of 30 millitorr (mT), high-frequency power of about 1700 watts (W), low-frequency power of about 4500 watts (W), flow of tetrafluoromethane ($CF_4$) at about 30 sccm, and flow of argon (Ar) at about 600 sccm.

Figures 9, 10, 11:
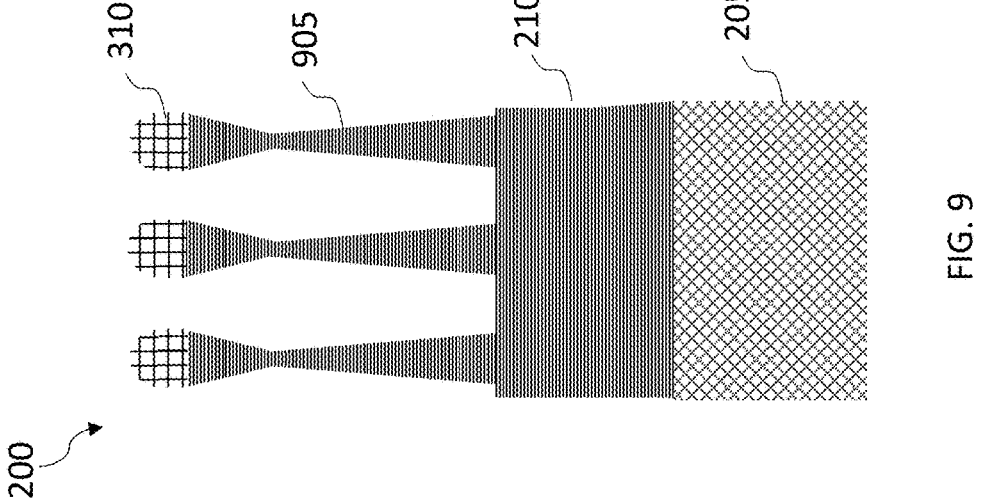

Corresponding to operation 130 of FIG. 1, FIG. 9 is a cross-sectional view of the structure 200 in which the pattern 315 (FIG. 4) is partially transferred to the first hardmask layer 210 and the second hardmask layer 310 remains and may be optionally trimmed, in accordance with various embodiments. Still corresponding to operation 130 of FIG. 1, FIG. 10 is a cross-sectional view of the structure 200 in which a modification layer 1010 is formed along sidewalls of the pattern partially transferred into the first hardmask layer 210 and further over a top surface of the (e.g., trimmed) second hardmask layer 310, in accordance with various embodiments. Still corresponding to operation 130 of FIG. 1, FIG. 11 is a cross-sectional view of the structure 200 in which the first hardmask layer 210 is continued to be etched, in accordance with various embodiments.

In some embodiments, the pattern 315 in the second hardmask layer 310 may be partially transferred to the first hardmask layer 210 by selectively etch the first hardmask layer 210, forming one or more protruding structures 905, as shown in FIG. 9. The pattern 315 may be partially formed in the first hardmask layer 210 by not etching through the first hardmask layer 210 (i.e., with the substrate 205 still overlaid by a lower portion of the first hardmask layer 210). For example, the protruding structures 905 can be partially formed by directionally etching the first hardmask layer 210 through a number of reactive ions. In some embodiments, an upper portion of the protruding structures 905 may include a bowing portion, and the protruding structures 905 each have a bottom surface connected to the remaining portion of the first hardmask layer 210. Such a bowing portion may result from deflection of the ions. Stated another way, the upper portions of sidewalls of each of the protruding structures 905 are spaced from each other with a first distance that is shorter than a second distance of any other portions of the sidewalls. The bowing portion may sometimes be referred to as a (e.g., laterally) recessed portion.

During or after forming the protruding structures 905 (or transferring the pattern 315 from the second hardmask layer 310 to the first hardmask layer 210), the second hardmask layer 310 may be trimmed. Next, the modification layer 1010 is formed to extend along at least the upper portions of the sidewalls of the protruding structures 905 and overlay the top surface of the second hardmask layer 310, as shown in FIG. 10. In various embodiments of the present disclosure, the modification layer 1010 can be formed by a non-cyclic deposition process (e.g., a Chemical Vapor Deposition (CVD) process and a Physical Vapor Deposition (PVD) process), thereby allowing the modification layer 1010 to be formed with a greater thickness around the recessed portions of the protruding structures 905. As such, the modification layer 1010 can compensate the distance difference between the recessed portion and the other portions. Stated another way, the protruding structures 905 can each be modified to have its sidewalls spaced from each other with a uniform distance. In some embodiments, the distance of the recessed portion combined with two times a (e.g., maximum) thickness of the modification layer 1010 is about equal to the distance of other non-recessed portions.

In one aspect of the present disclosure, the modification layer 1010 may include metal atoms. For example, the modification layer 1010 may consist of tantalum nitride (TaN). As a non-limiting example, the modification layer 1010 can be formed by a PVD process with the following recipe: Ta(N) composition: 0%-30% (Ar/N flow rate friction: 0-0.3), Temperature: −30 C to room temperature, Pressure: 0.1 mT to 90 mT, DC: 1000 to 12000 W, ICP: 1000 to 6000 W, Stage bias: 200-700 W. In one aspect of the present disclosure, the modification layer 1010 may include a polymer consisting of carbon atoms and fluorine atoms. For example, the modification layer 1010 may consist of a fluoropolymer or fluoroplastic. As a non-limiting example, the modification layer 1010 can be formed by a CVD process with the following recipe: pressure of 30 millitorr (mT), high-frequency power of about 1700 watts (W), low-frequency power of about 4500 watts (W), flow of tetrafluoromethane ($CF_4$) at about 30 sccm, and flow of argon (Ar) at about 600 sccm.

After forming the modification layer 1010, the remaining portion of the first hardmask layer 210 is continued to be etched until the substrate 205 is exposed, as shown in FIG. 11. As such, the pattern 315 may be fully transferred into the first hardmask layer 210 by etching through the remaining portion of the first hardmask layer 210 until the substrate 205 is exposed. For example, the protruding structures 905 can be fully formed by directionally etching the first hardmask layer 210 through a number of reactive ions.

Figure 14:
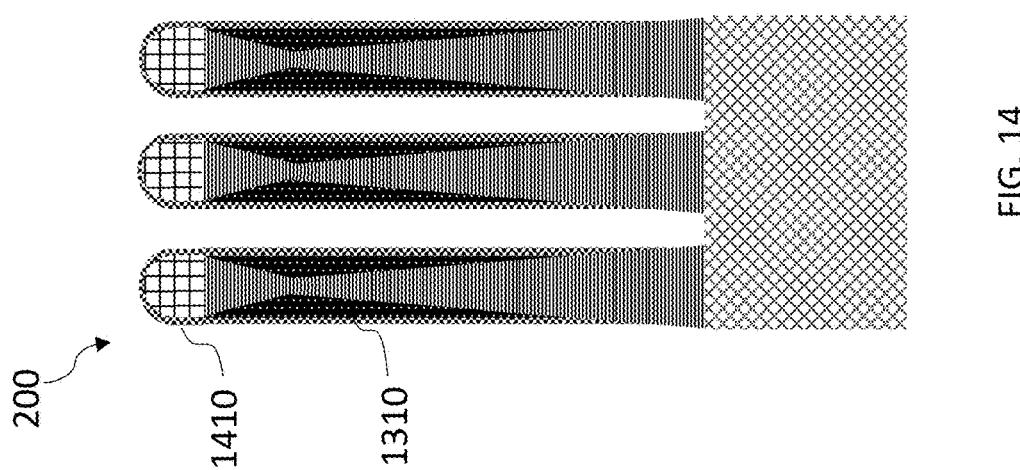
Figure 13:
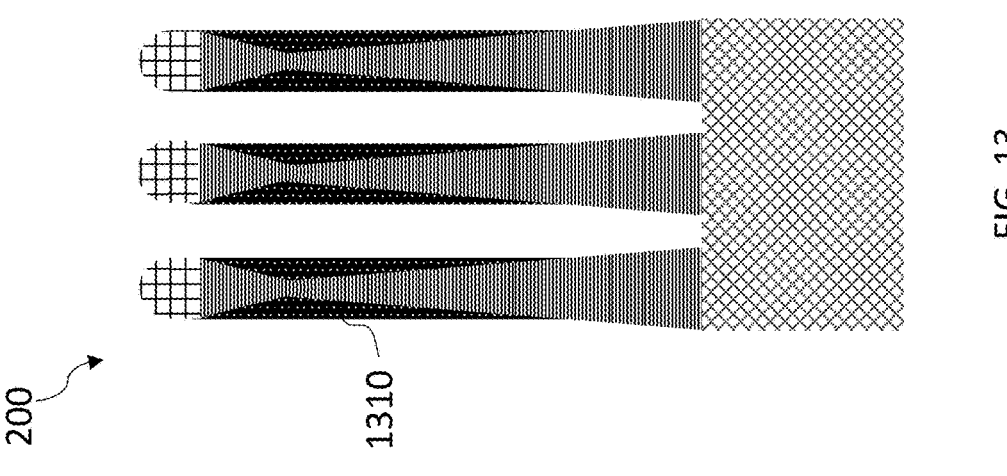
Figure 12:
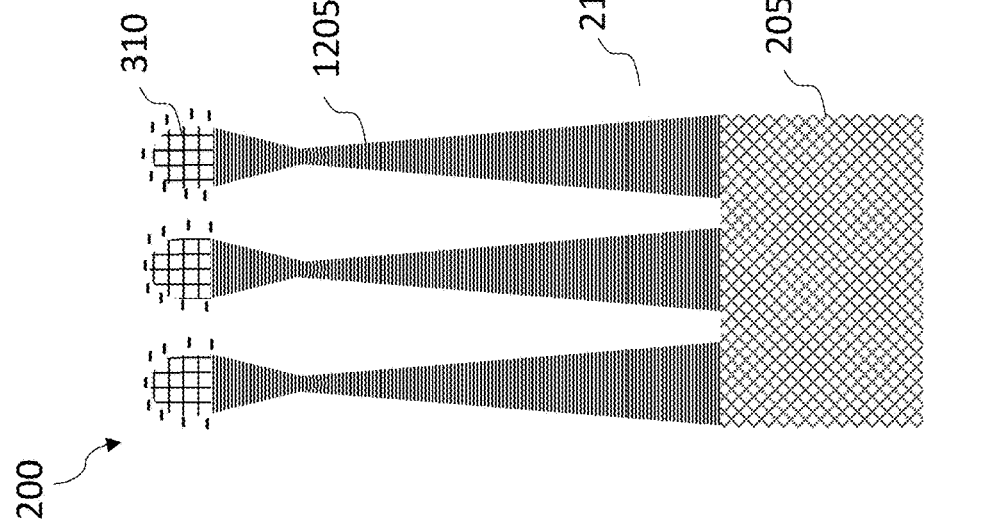

Corresponding to operation 140 of FIG. 1, FIG. 12 is a cross-sectional view of the structure 200 in which the pattern 315 (FIG. 4) is transferred to the first hardmask layer 210 and the second hardmask layer 310 remains and may be negatively charged, in accordance with various embodiments. Still corresponding to operation 140 of FIG. 1, FIG. 13 is a cross-sectional view of the structure 200 in which a modification layer 1310 is formed along sidewalls of the pattern transferred into the first hardmask layer 210 and further over a top surface of the second hardmask layer 310, in accordance with various embodiments. Still corresponding to operation 140 of FIG. 1, FIG. 14 is a cross-sectional view of the structure 200 in which another modification layer 1410 is formed, in accordance with various embodiments.

In some embodiments, the pattern 315 in the second hardmask layer 310 may be transferred to the first hardmask layer 210 by selectively etch the first hardmask layer 210, forming one or more protruding structures 1205, as shown in FIG. 12. The pattern 315 may be formed in the first hardmask layer 210 by etching through the first hardmask layer 210. For example, the protruding structures 1205 can be formed by directionally etching the first hardmask layer 210 through a number of reactive ions. In some embodiments, an upper portion of the protruding structures 1205 may include a bowing portion. Such a bowing portion may result from deflection of the ions. Stated another way, the upper portions of sidewalls of each of the protruding structures 1205 are spaced from each other with a first distance that is shorter than a second distance of any other portions of the sidewalls. The bowing portion may sometimes be referred to as a (e.g., laterally) recessed portion.

During or after forming the protruding structures 1205 (or transferring the pattern 315 from the second hardmask layer 310 to the first hardmask layer 210), the second hardmask layer 310 may be negatively charged. In some embodiments, the charges can be accumulated at the tip of each of the protruding structures 1205 by applying a negative voltage to the workpiece (e.g., the substrate 205). Next, the modification layer 1310 is formed to extend along at least the upper portions of the sidewalls of the protruding structures 1205, as shown in FIG. 13. As the second hardmask layer 310 is negatively charged, the modification layer 1310 may not be formed on a surface of the second hardmask layer 310. In various embodiments of the present disclosure, the modification layer 1310 can be formed by a non-cyclic deposition process (e.g., a Chemical Vapor Deposition (CVD) process and a Physical Vapor Deposition (PVD) process), thereby allowing the modification layer 1310 to be formed with a greater thickness around the recessed portions of the protruding structures 1205. As such, the modification layer 1310 can compensate the distance difference between the recessed portion and the other portions. Stated another way, the protruding structures 1205 can each be modified to have its sidewalls spaced from each other with a uniform distance. In some embodiments, the distance of the recessed portion combined with two times a (e.g., maximum) thickness of the modification layer 1310 is about equal to the distance of other non-recessed portions.

In one aspect of the present disclosure, the modification layer 1310 may include metal atoms. For example, the modification layer 1310 may consist of tantalum nitride (TaN). As a non-limiting example, the modification layer 1310 can be formed by a PVD process with the following recipe: Ta(N) composition: 0%-30% (Ar/N flow rate friction: 0-0.3), Temperature: −30 C to room temperature, Pressure: 0.1 mT to 90 mT, DC: 1000 to 12000 W, ICP: 1000 to 6000 W, Stage bias: 200-700 W. In one aspect of the present disclosure, the modification layer 1310 may include a polymer consisting of carbon atoms and fluorine atoms. For example, the modification layer 1310 may consist of a fluoropolymer or fluoroplastic. As a non-limiting example, the modification layer 1310 can be formed by a CVD process with the following recipe: pressure of 30 millitorr (mT), high-frequency power of about 1700 watts (W), low-frequency power of about 4500 watts (W), flow of tetrafluoromethane ($CF_4$) at about 30 sccm, and flow of argon (Ar) at about 600 sccm.

After forming the modification layer 1310, the modification layer 1410 can be (e.g., conformally) formed over the workpiece, as shown in FIG. 14. The modification layer 1410 can extend along the sidewalls of the protruding structures 1205 and overlay the second hardmask layer 310. The modification layer 1410 may include aluminum oxide. In some embodiments, the modification layer 1410 can be formed by a cyclic deposition process (e.g., an Atomic Layer Deposition (ALD) process).

Figure 17:
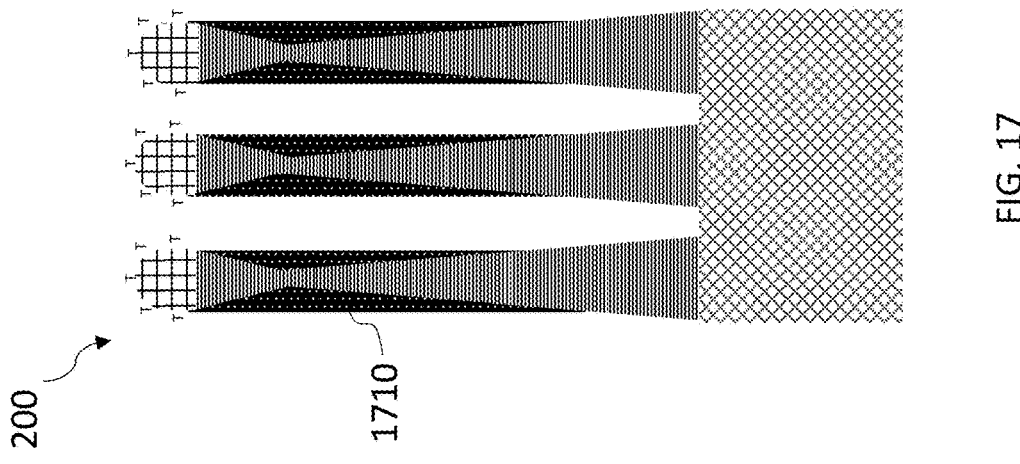
Figure 16:
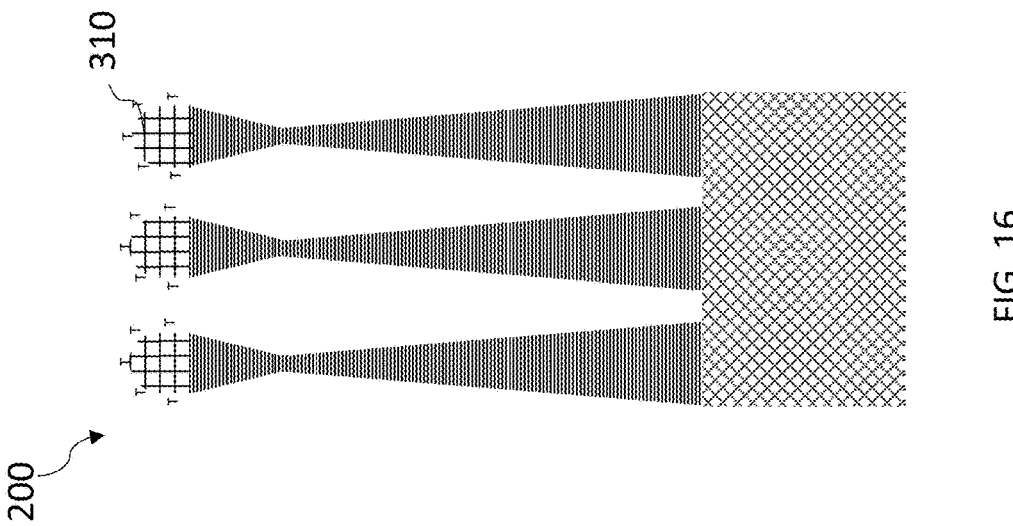
Figure 15:
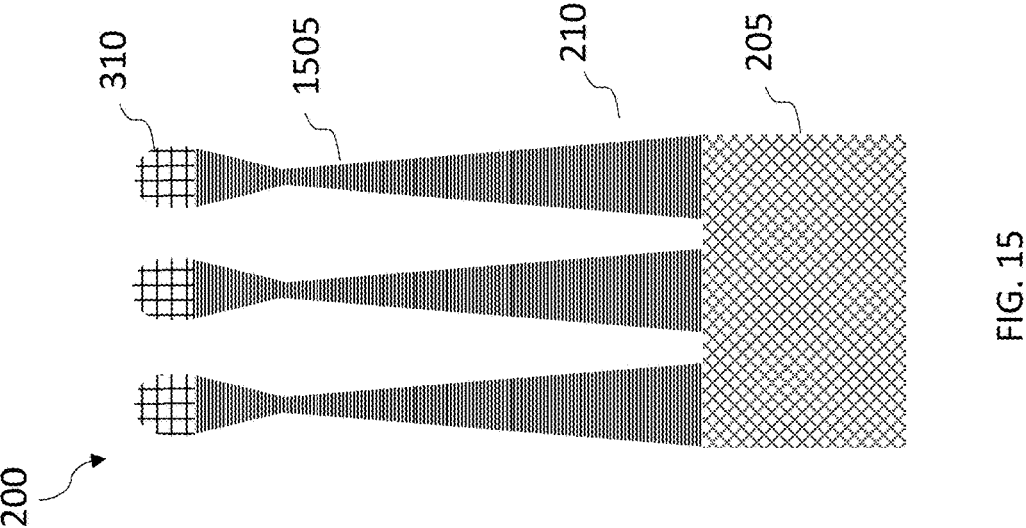

Corresponding to operation 150 of FIG. 1, FIG. 15 is a cross-sectional view of the structure 200 in which the pattern 315 (FIG. 4) is transferred to the first hardmask layer 210 and the second hardmask layer 310 remains, in accordance with various embodiments. Still corresponding to operation 150 of FIG. 1, FIG. 16 is a cross-sectional view of the structure 200 in which an exposed surface of the second hardmask layer 310 is modified, in accordance with various embodiments. Still corresponding to operation 150 of FIG. 1, FIG. 17 is a cross-sectional view of the structure 200 in which a modification layer 1710 is selectively formed along sidewalls of the pattern transferred into the first hardmask layer 210, in accordance with various embodiments.

In some embodiments, the pattern 315 in the second hardmask layer 310 may be transferred to the first hardmask layer 210 by selectively etch the first hardmask layer 210, forming one or more protruding structures 1505, as shown in FIG. 15. The pattern 315 may be formed in the first hardmask layer 210 by etching through the first hardmask layer 210. For example, the protruding structures 1505 can be formed by directionally etching the first hardmask layer 210 through a number of reactive ions. In some embodiments, an upper portion of the protruding structures 1505 may include a bowing portion. Such a bowing portion may result from deflection of the ions. Stated another way, the upper portions of sidewalls of each of the protruding structures 1505 are spaced from each other with a first distance that is shorter than a second distance of any other portions of the sidewalls. The bowing portion may sometimes be referred to as a (e.g., laterally) recessed portion.

During or after forming the protruding structures 1505 (or transferring the pattern 315 from the second hardmask layer 310 to the first hardmask layer 210), the exposed surface of the second hardmask layer 310 may be modified by silylation on the exposed surface with chemical vapor like alkyl silane, alkoxysilane, alkyl alkoxysilane, alkyl siloxane, alkoxysiloxane, alkyl alkoxysiloxane, aryl silane, acyl silane, aryl siloxane, acyl siloxane, silazane, dimethylsilane dimethylamine, trimethylsilane dimethylamine, bis(dimethylamino)dimethylsilane, N,O bistrimethylsilyltrifluoroacetamide, or trimethylsilyl-pyrrole. The process pressure is between 5-10 Torr, the process temperature is around 100 C-250 C and the duration of surface exposure is around 10 seconds to a couple of minutes. as shown in FIG. 16. Next, the modification layer 1710 is formed to extend along at least the upper portions of the sidewalls of the protruding structures 1505, as shown in FIG. 17. As the surface of the second hardmask layer 310 is modified, the modification layer 1710 may not be formed on a surface of the second hardmask layer 310. In various embodiments of the present disclosure, the modification layer 1710 can be formed by a non-cyclic deposition process (e.g., a Chemical Vapor Deposition (CVD) process and a Physical Vapor Deposition (PVD) process), thereby allowing the modification layer 1710 to be formed with a greater thickness around the recessed portions of the protruding structures 1505. As such, the modification layer 1710 can compensate the distance difference between the recessed portion and the other portions. Stated another way, the protruding structures 1505 can each be modified to have its sidewalls spaced from each other with a uniform distance. In some embodiments, the distance of the recessed portion combined with two times a (e.g., maximum) thickness of the modification layer 1710 is about equal to the distance of other non-recessed portions.

In one aspect of the present disclosure, the modification layer 1710 may include metal atoms. For example, the modification layer 1710 may consist of CVD Ruthenium (Ru), and the typical process condition is Temperature: 100-250 C, Pressure: 10 mT to 500 mT, Deposition rate: 0.5-5 nm/min, Precursor: Ru carbonyl.

After any of operation 110, 120, 130, 140, or 150, the substrate 205 may be etched using the pattern (e.g., the protruding structures in the first hardmask layer 210) and the modification layer both serving as a mask. For example, following FIGS. 5-6, the substrate 205 can be (e.g., directionally) etched using the protruding structures 505 and the modification layer 610 both serving as a mask. For another example, following FIGS. 7-8, the substrate 205 can be (e.g., directionally) etched using the protruding structures 705 and the modification layer 810 both serving as a mask. For yet another example, following FIGS. 9-11, the substrate 205 can be (e.g., directionally) etched using the protruding structures 905 and the modification layer 1010 both serving as a mask. For yet another example, following FIGS. 12-14, the substrate 205 can be (e.g., directionally) etched using the protruding structures 1205 and the modification layers 1310-1410 all serving as a mask. For yet another example, following FIGS. 15-17, the substrate 205 can be (e.g., directionally) etched using the protruding structures 1505 and the modification layer 1710 both serving as a mask.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for fabricating semiconductor devices, comprising:

forming a first hardmask layer over a substrate;

forming a second hardmask layer over the first hardmask layer;

transferring a pattern from the second hardmask layer to the first hardmask layer, wherein the pattern in the first hardmask layer comprises a plurality of protruding structures, and each of the plurality of protruding structures has respective portions of its two sidewalls extending toward each other;

depositing a modification layer from a precursor material source in a non-cyclic deposition process extending along at least the respective portions of the sidewalls of each of the protruding structures, wherein the portions of the sidewalls of each of the protruding structures are spaced from each other with a first distance that is shorter than a second distance of any other portions of the sidewalls, and wherein the modification layer provides substantially uniform sidewall distance along a height of the protruding structures; and etching the substrate with the protruding structures and the modification layer both serving as a mask.

2. The method of claim 1, wherein the substrate includes one or more dielectric layers, the first hardmask layer includes an amorphous carbon layer or an organic under layer, and the second hardmask layer includes silicon oxynitride.

3. The method of claim 1, wherein the first distance combined with two times a thickness of the modification layer is about equal to the second distance.

4. The method of claim 1, wherein the modification layer includes metal atoms.

5. The method of claim 1, wherein the modification layer includes a polymer consisting of carbon atoms and fluorine atoms.

6. The method of claim 1, wherein the non-cyclic deposition process comprises: a Chemical Vapor Deposition (CVD) process and a Physical Vapor Deposition (PVD) process.

7. The method of claim 1, prior to depositing the modification layer, further comprising completely removing the second hardmask layer.

8. The method of claim 1, while depositing the modification layer, further comprising retaining at least a portion of the second hardmask layer.

9. The method of claim 1, further comprising:

prior to depositing the modification layer, transferring the pattern from the second hardmask layer to the first hardmask layer by partially etching the first hardmask layer; and subsequently to depositing the modification layer, continuing transferring the pattern by etching through a remaining portion of the first hardmask layer.

10. The method of claim 1, further comprising depositing another modification layer over the modification layer using an Atomic Layer Deposition (ALD) process.

11. The method of claim 1, further comprising:

modifying an exposed surface of the second hardmask layer; and depositing the modification layer only on the first hardmask layer.

12. A method for fabricating semiconductor devices, comprising:

forming a first hardmask layer over a substrate;

forming a second hardmask layer over the first hardmask layer;

transferring a pattern of the second hardmask layer to the first hardmask layer;

depositing a modification layer from a precursor material source in a non-cyclic deposition process extending along a recessed portion of the pattern in the first hardmask layer, wherein the recessed portion of the pattern has opposing surfaces spaced from each other with a first distance that is shorter than a second distance of any other portions of the pattern, and wherein the modification layer provides substantially uniform sidewall distance between the opposing surfaces along a height of the pattern; and etching the substrate with the pattern in the first hardmask layer and the modification layer both serving as a mask.

13. The method of claim 12, wherein the modification layer includes metal atoms.

14. The method of claim 12, wherein the modification layer includes a polymer consisting of carbon atoms and fluorine atoms.

15. The method of claim 12, wherein the non-cyclic deposition process comprises: a Chemical Vapor Deposition (CVD) process and a Physical Vapor Deposition (PVD) process.

16. A method for fabricating semiconductor devices, comprising:

forming a first hardmask layer over a substrate;

forming a second hardmask layer over the first hardmask layer;

transferring a pattern of the second hardmask layer to the first hardmask layer;

forming a modification layer extending along a recessed portion of the pattern in the first hardmask layer using a non-cyclic deposition process, wherein the recessed portion has a first spacing between opposing surfaces that is shorter than a second spacing of any other portion of the pattern, and wherein the modification layer provides substantially uniform distance along a height of the pattern; and etching the substrate with the pattern in the first hardmask layer and the modification layer both serving as a mask.

17. The method of claim 16, wherein the modification layer includes metal atoms.

18. The method of claim 16, wherein the modification layer includes a polymer consisting of carbon atoms and fluorine atoms.

* * * * *